(12) United States Patent
Hashimoto et al.

(10) Patent No.: US 9,245,840 B2
(45) Date of Patent: *Jan. 26, 2016

(54) SEMICONDUCTOR DEVICE HAVING AN INDUCTOR SURROUNDS THE INTERNAL CIRCUIT

(71) Applicant: Renesas Electronics Corporation, Kanagawa (JP)

(72) Inventors: Takasuke Hashimoto, Kanagawa (JP); Shinichi Uchida, Kanagawa (JP); Yasutaka Nakashiba, Kanagawa (JP); Takatsugu Nemoto, Kanagawa (JP)

(73) Assignee: Renesas Elecronics Corporation, Kanagawa (JP)

( * ) Notice: Subject to any disclaimer, the term of this patent is extended or adjusted under 35 U.S.C. 154(b) by 46 days.

This patent is subject to a terminal disclaimer.

(21) Appl. No.: 14/527,293

(22) Filed: Oct. 29, 2014

(65) Prior Publication Data

US 2015/0048481 A1 Feb. 19, 2015

Related U.S. Application Data

(63) Continuation of application No. 14/012,324, filed on Aug. 28, 2013, now Pat. No. 8,907,460.

(30) Foreign Application Priority Data

Sep. 19, 2012 (JP) ................. 2012-205722

(51) Int. Cl.
*H01L 23/552* (2006.01)
*H01L 23/522* (2006.01)
*H01L 23/58* (2006.01)
*H05K 9/00* (2006.01)

(52) U.S. Cl.
CPC ........ *H01L 23/5225* (2013.01); *H01L 23/5227* (2013.01); *H01L 23/585* (2013.01); *H01L 2924/0002* (2013.01); *H05K 9/00* (2013.01)

(58) Field of Classification Search
CPC . H01L 23/5225; H01L 23/5227; H01L 28/10; H01L 2924/1206; H01L 2924/14; H01L 2924/19042
USPC .................. 257/508, 531, 659, 662, E21.022
See application file for complete search history.

(56) References Cited

U.S. PATENT DOCUMENTS

| | | | |
|---|---|---|---|
| 6,982,477 B2 | 1/2006 | Adan | |
| 8,907,460 B2* | 12/2014 | Hashimoto et al. | 257/659 |
| 2006/0049481 A1 | 3/2006 | Tiemeijer et al. | |

FOREIGN PATENT DOCUMENTS

| | | |
|---|---|---|
| JP | 02072660 A | 3/1990 |
| JP | 2001-326526 A | 11/2001 |
| JP | 2004-311655 A | 11/2004 |
| JP | 2009-194302 A | 8/2009 |
| WO | 2004-055839 A1 | 7/2004 |

* cited by examiner

*Primary Examiner* — Hoai V Pham
(74) *Attorney, Agent, or Firm* — Sughrue Mion, PLLC

(57) ABSTRACT

To suppress the noise caused by an inductor leaks to the outside, and also to be configured such that magnetic field intensity change reaches the inductor.
An inductor surrounds an internal circuit in a planar view and also is coupled electrically to the internal circuit. The upper side of the inductor is covered by an upper shield part and the lower side of the inductor is covered by a lower shield part. The upper shield part is formed by the use of a multilayered wiring layer. The upper shield part has plural first openings. The first opening overlaps the inductor in the planar view.

17 Claims, 21 Drawing Sheets

SEMICONDUCTOR DEVICE HAVING AN INDUCTOR SURROUNDS THE INTERNAL CIRCUIT

CROSS-REFERENCE TO RELATED APPLICATION

This application is a Continuation application of U.S. application Ser. No. 14/012,324, filed Aug. 28, 2013, which is based on Japanese Patent Application No. 2012-205722 filed on Sep. 19, 2012, the disclosures of which are incorporated herein by reference in their entirety.

BACKGROUND

The present invention relates to a semiconductor device and relates to a technique which can be applied to a semiconductor device including an inductor, for example.

An inductor is used in a power meter which detects power amount flowing in a power line. When current amount flowing in the power line is changed, magnetic field intensity generated from the power line changes. Voltage is generated across the inductor according to this change of the magnetic field intensity. The power meter detects the power amount flowing in the power line by monitoring this voltage.

Note that Patent Document 1 (Japanese Patent Laid-Open No. 2001-326526) describes the use of an inductor as an antenna which performs read-out and write-in for a data carrier of an electromagnetic induction type. Patent Document 1 describes the upper side and the lower side of the inductor to be covered by electric shield patterns for suppressing leakage of an electric field component from the inductor.

Further, Patent Document 2 (Japanese Patent Laid-Open No. 2009-194302) describes the upper side and the lower side of an inductor of a passive component to be covered by shields in a semiconductor device for wireless communication. This shield is provided for blocking a magnetic field and formed by a wiring pattern.

Further, Patent Document 3 (WO2004/055839) describes the upper side and the lower side of an inductor to be covered by shields. This shield is patterned for suppressing mirror current flow.

Note that Patent Documents 4 (Japanese Patent Laid-Open No. 1990-72660) and 5 (Japanese Patent Laid-Open No. 2004-311655) describe an inductor to be surrounded by a shield in the periphery thereof.

SUMMARY

When realizing an apparatus detecting power amount flowing in a power line by a semiconductor device, it is necessary to provide an inductor and an internal circuit for the semiconductor device. When the power amount is changed, a voltage change is generated across the inductor. Electric field fluctuation is generated around the inductor by this voltage change, and this fluctuation causes noise and may provide influence on operation of the internal circuit. For suppressing this problem, it is necessary to cover the upper side and the lower side of the inductor by conductor patterns. When the upper side and the lower side of the inductor are covered by the conductor patterns, however, magnetic field intensity change does not reach the inductor and detection accuracy of the power amount is degraded. The other problems and the new features will become clear from the description of the present specification and the accompanying drawings.

According to an embodiment, an inductor is formed by the use of a multilayered wiring layer and provided so as to surround an internal circuit. An upper shield part is provided in a layer higher than the inductor and a lower shield part is provided in a layer lower than the inductor. The upper shield part is provided with plural first openings. The first opening overlaps the inductor in a planar view.

According to the above described embodiment, it is possible to suppress leakage of noise caused by the inductor to the outside and also to cause intensity change of a magnetic field to reach the inductor.

DETAILED DESCRIPTION

Hereinafter, embodiments will be explained by the use of the drawings. Note that, in all the drawings, the same constituent is provided with the same sign and explanation thereof will be omitted optionally.

First Embodiment

Figure 1:
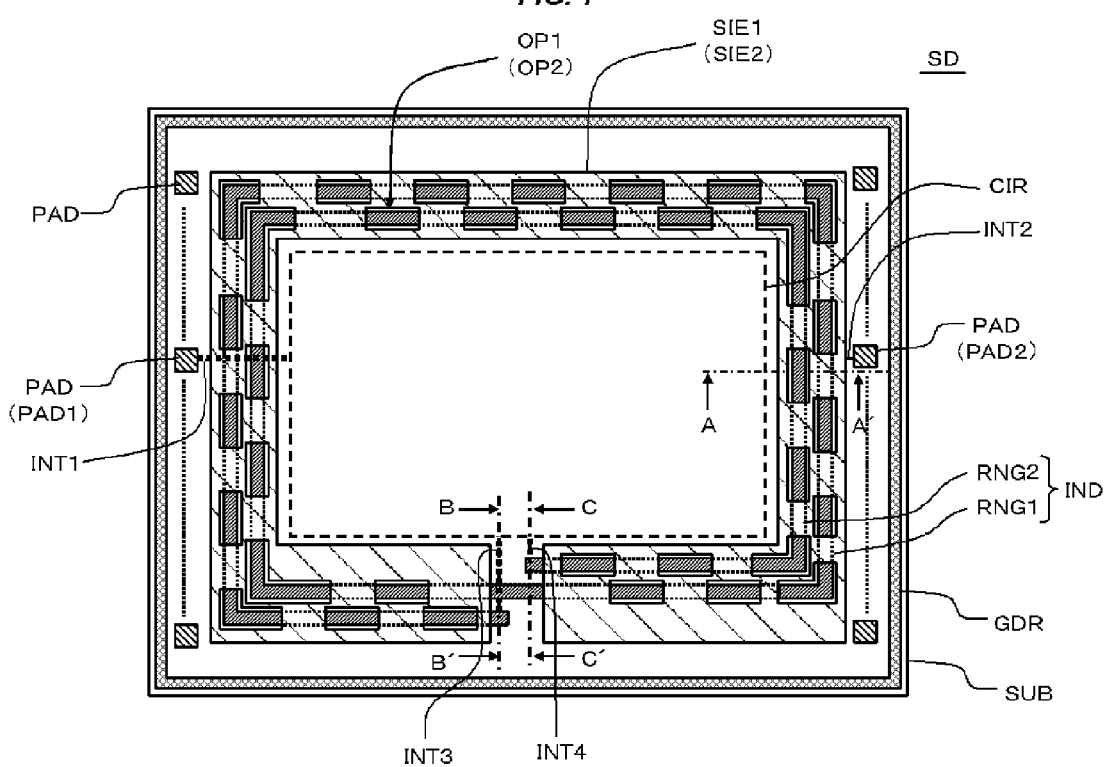
FIG. 1 is a plan view showing a configuration of a semiconductor device according to a First Embodiment.

FIG. 1 is a plan view showing a configuration of a semiconductor device SD according to a First Embodiment. FIG.

Figure 3:
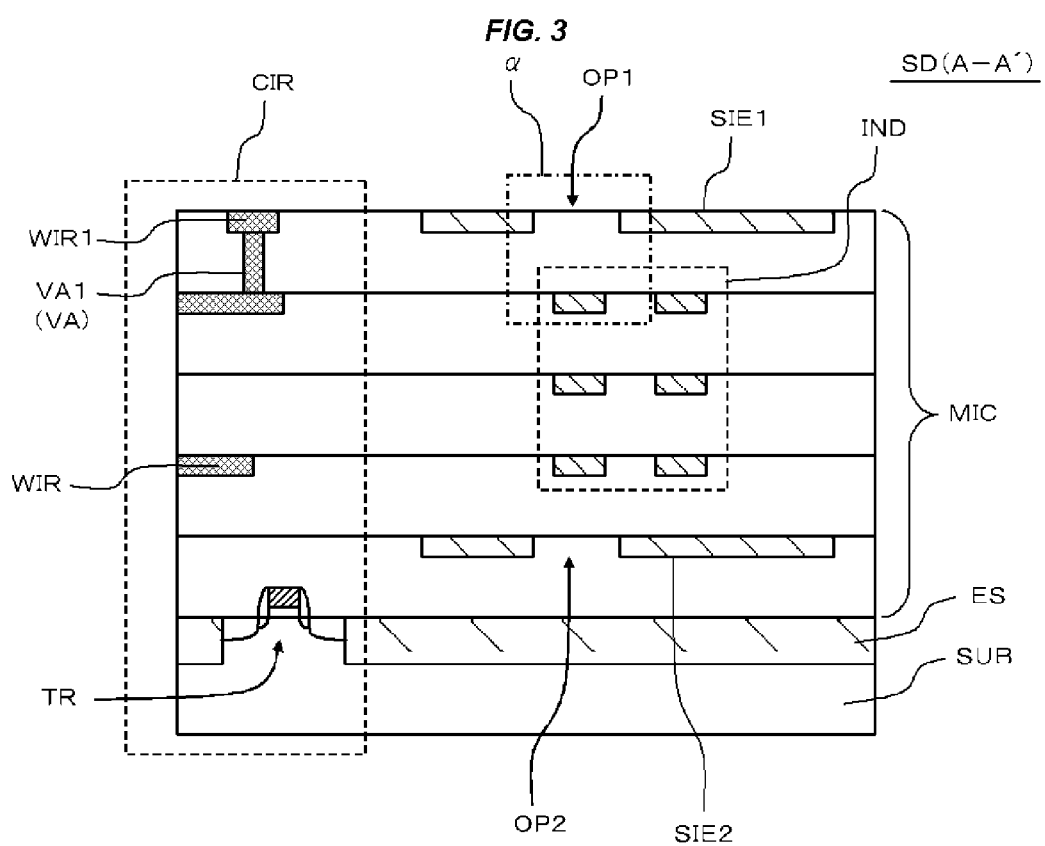
FIG. 3 is an A-A' cross-sectional view of FIG. 1.

2 is a diagram omitting an upper shield part SIE1 and a lower shield part SIE2 from FIG. 1. FIG. 3 is an A-A' cross-sectional view of FIG. 1. The semiconductor device SD is provided with a substrate SUB, a multilayered wiring layer MIC, an internal circuit CIR, an inductor IND, an upper shield part SIE1, and a lower shield part SIE2. The substrate SUB is a semiconductor substrate such as a silicon substrate, for example.

The multilayered wiring layer MIC is formed over the substrate SUB and includes at least two layers of internal wirings WIR and at least one layer of a via VA, as shown in FIG. 3. The internal circuit CIR includes a transistor TR. The transistor TR is formed over the substrate SUB.

As shown in FIG. 3, the inductor IND is provided in the same layer as at least one layer of the internal wiring WIR included in the multilayered wiring layer MIC. The inductor IND surrounds the internal circuit CIR in a planar view and also both ends thereof are coupled electrically to the internal circuit CIR, as shown in FIG. 1.

The upper shield part SIE1 is a pattern formed by material having conductivity, and formed by the use of the multilayered wiring layer MIC as shown in FIG. 3. The upper shield part SIE1 overlaps the inductor IND in the planar view as shown in FIG. 1 and FIG. 3, and is located in a layer higher than the inductor IND in the thickness direction. As shown in FIG. 1, the upper shield part SIE1 has plural first openings OP1. The first opening OP1 overlaps the inductor IND in the planar view.

The lower shield part SIE2 is a pattern having conductivity, and overlaps the inductor IND in the planar view and is located in a layer lower than the inductor in the thickness direction.

According to the present embodiment, the upper side of the inductor IND is covered by the upper shield part SIE1 and the lower side of the inductor IND is covered by the lower shield part SIE2. Thereby, it is possible to suppress the noise caused by the inductor leaks to the outside. Further, since the first opening OP1 is formed in the upper shield part SIE1, intensity change of an external magnetic field reaches the inductor IND. Hereinafter, details will be explained.

Figure 2:
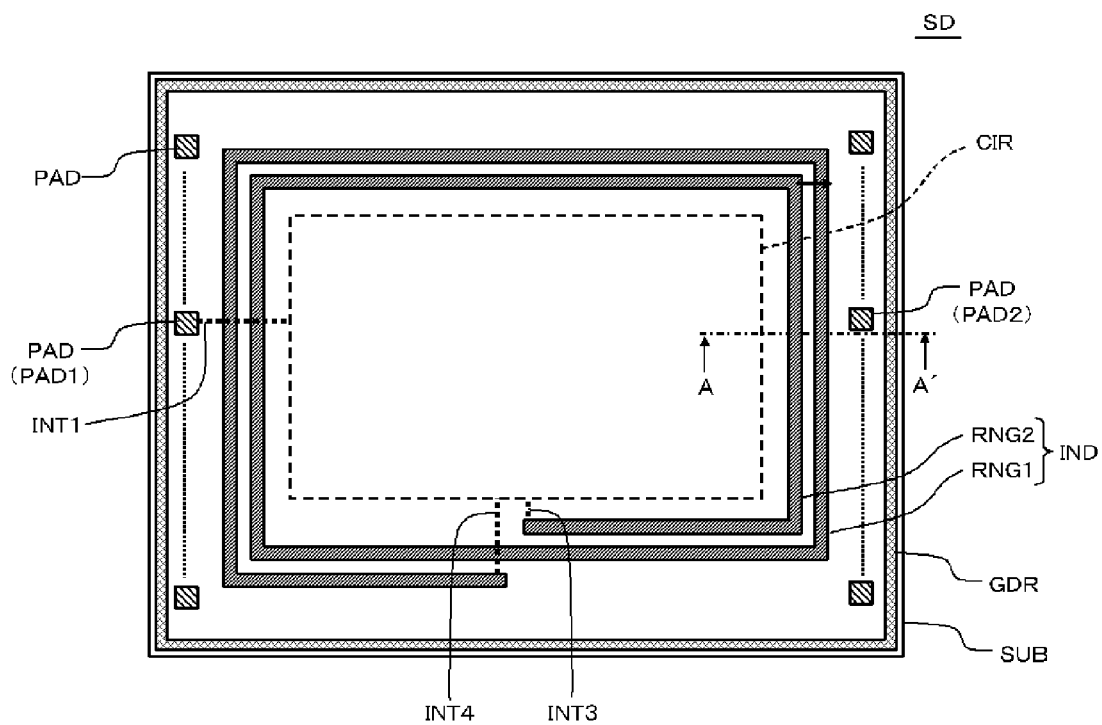
FIG. 2 is a diagram omitting an upper shield part and a lower shield part from FIG. 1.

First, by the use of FIG. 1 and FIG. 2, a configuration of the semiconductor device SD will be explained. In the present embodiment, the semiconductor device SD is used at least as a part of a power meter. The internal circuit CIR of the semiconductor device SD is coupled electrically with both ends of the inductor IND through a third coupling path INT3 and a fourth coupling path INT4. That is, the internal circuit CIR can detect voltage generated across the inductor IND. Then, the internal circuit CIR calculates a power amount flowing in a power line using the voltage generated in the inductor IND. Here, each of the third coupling path INT3 and the fourth coupling path INT4 has at least a wiring and sometimes includes a via.

The inductor IND has a wiring disposed so as to surround the internal circuit CIR. The inductor IND is preferably extended in plural turns around the internal circuit CIR. Thereby, detection sensitivity of magnetic field change by the inductor IND is improved. In an example shown in these drawings, the inductor IND includes a first ring-like member RNG1 which configures the outermost perimeter and a second ring-like member RNG2 which configures a perimeter thereinside. That is, the first ring-like member RNG1 and the second ring-like member RNG2 are shifted from each other in the planar view.

The semiconductor device SD is provided with a guard ring GDR and plural electrode pads PAD. The guard ring GDR is provided between the inductor IND and the edge of the substrate SUB in the planar view and surrounds the whole perimeter of the inductor IND. The electrode pad PAD is provided between the inductor IND and the guard ring GDR in the planar view.

A first electrode pad PAD1 which is one of the electrode pads PAD is coupled to the internal circuit CIR through a first coupling path INT1, and a second electrode pad PAD2 of another electrode pad PAD is coupled to the upper shield part SIE1 and the lower shield part SIE2 through a second coupling path INT2. A fixed potential (e.g., power source potential or ground potential) is applied to the second electrode pad PAD2. The same fixed potential as that of the second electrode pad PAD2 is applied also to the first electrode pad PAD1. That is, in the present embodiment, the upper shield part SIE1 and the lower shield part SIE2 are provided with the fixed potential by a path different from the path for the internal circuit CIR. Thereby, it is possible to suppress that voltage fluctuation generated in the upper shield part SIE1 or the lower shield part SIE2 is propagated to the internal circuit CIR as noise.

The upper shield part SIE1 surrounds the internal circuit CIR except a region where the third coupling path INT3 and the fourth coupling path INT4 are provided. The width of the upper shield part SIE1 is larger than the width of a region where the inductor IND is provided.

The upper shield part SIE1 has the plural first openings OP1. The first openings OP1 are provided above the first ring-like member RNG1 and above the second ring-like member RNG2 in the inductor IND, respectively. Thereby, compared to a case in which the first opening OP1 is located across both of the first ring-like member RNG1 and the second ring-like member RNG2, the area of a conductor configuring the upper shield part SIE1 can be made larger. In this case, it is possible to obtain a higher shield effect by the upper shield part SIE1.

In the example shown in these drawings, the first opening OP1 located above the first ring-like member RNG1 and the first opening OP1 located above the second ring-like member RNG2 are arranged alternately in a direction parallel to the inductor IND. Thereby, it is possible to suppress that the first opening OP1 located above the first ring-like member RNG1 and the first opening OP1 located above the second ring-like member RNG2 are connected with each other. This effect becomes evident when the first opening OP1 located above the first ring-like member RNG1 and the first opening OP1 located above the second ring-like member RNG2 do not have parts overlapping each other in the extension direction of the inductor IND.

Here, a planar shape of the first opening OP1 is rectangular. The longitudinal direction of the first opening OP1 is parallel to the extension direction of the inductor IND. Thereby, it is possible to increase a ratio of the opening in a part of the upper shield part SIE1 located above the inductor IND, while keeping the area of the conductor configuring the upper shield part SIE1.

Next, by the use of FIG. 3, there will be explained a cross-sectional structure of the semiconductor device SD. An element separation film ES is formed in the substrate SUB. The element separation film ES separates an element formation region where the transistor TR is formed, from the other region.

The multilayered wiring layer MIC is formed over the transistor TR and the element separation film ES. The multilayered wiring layer MIC includes the internal wiring WIR. The internal wiring WIR is a wiring configuring the internal circuit CIR or a power source line.

The multilayered wiring layer MIC includes plural wiring layers. Each of the wiring layers includes a layer where a via VA (or contact) is formed.

In an example shown in this drawing, the internal wiring WIR is embedded in an insulating film forming the wiring layer. Note that at least one of the internal wirings WIR may be formed over the insulating film forming the wiring layer. Further, the internal wiring WIR and the via VA may be formed separately or may be integrated together. The internal wiring WIR is Cu, Al, or W, for example. The internal wirings WIR in each of the wiring layers may be formed by the same material or may be formed by material different from others at least in a part thereof. The via VA is Cu, Al, or W, for example. The via VA and the internal wiring WIR may be formed to be integrated together, or may be formed as members different from each other.

Further, in this drawing, the internal wiring WIR is embedded in the surface layer of the interlayer insulating film. Note that, when the internal wiring WIR is formed by Al or W, the internal wiring WIR is located over the surface of the interlayer insulating film.

The inductor IND is formed in the same layer as at least one of the internal wirings WIR. In the example shown in this drawing, the inductor IND is formed by the use of the plural wiring layers. Thereby, the number of turns of the inductor IND is increased and the detection sensitivity of the magnetic field change by the inductor IND becomes higher.

In detail, the inductor IND is formed by the use of any wiring layer between a wiring layer not lower than the second layer and the second highest wiring layer. Then, the upper shield part SIE1 is formed in a layer higher than the inductor IND, and the lower shield part SIE2 is formed in a layer lower than the inductor IND.

In the example shown in this drawing, the upper shield part SIE1 is formed in a wiring layer one-layer higher than the wiring layer where the inductor IND is formed. In this layer, the electrode pad PAD shown in FIG. 1 and FIG. 2 may be formed.

Further, the lower shield part SIE2 is formed by the use of the multilayered wiring layer MIC. In the example shown in this drawing, the lowest layer of the inductor IND is formed by the use of the second wiring layer from the bottom. Then, the lower shield part SIE2 is formed by the use of the bottom wiring layer. Thereby, the lower shield part SIE2 is also formed by a metal pattern, and it is possible to obtain a higher shield effect by the lower shield part SIE2.

Then, the lower shield part SIE2 has plural second openings OP2. The second opening OP2 overlaps the inductor IND in the planar view. Thereby, the intensity change of the external magnetic field reaches the inductor further easily.

In detail, at least some (preferably all) of the second openings OP2 overlap the first openings OP1. Thereby, the intensity change of the external magnetic field reaches the inductor further easily.

Figure 4:
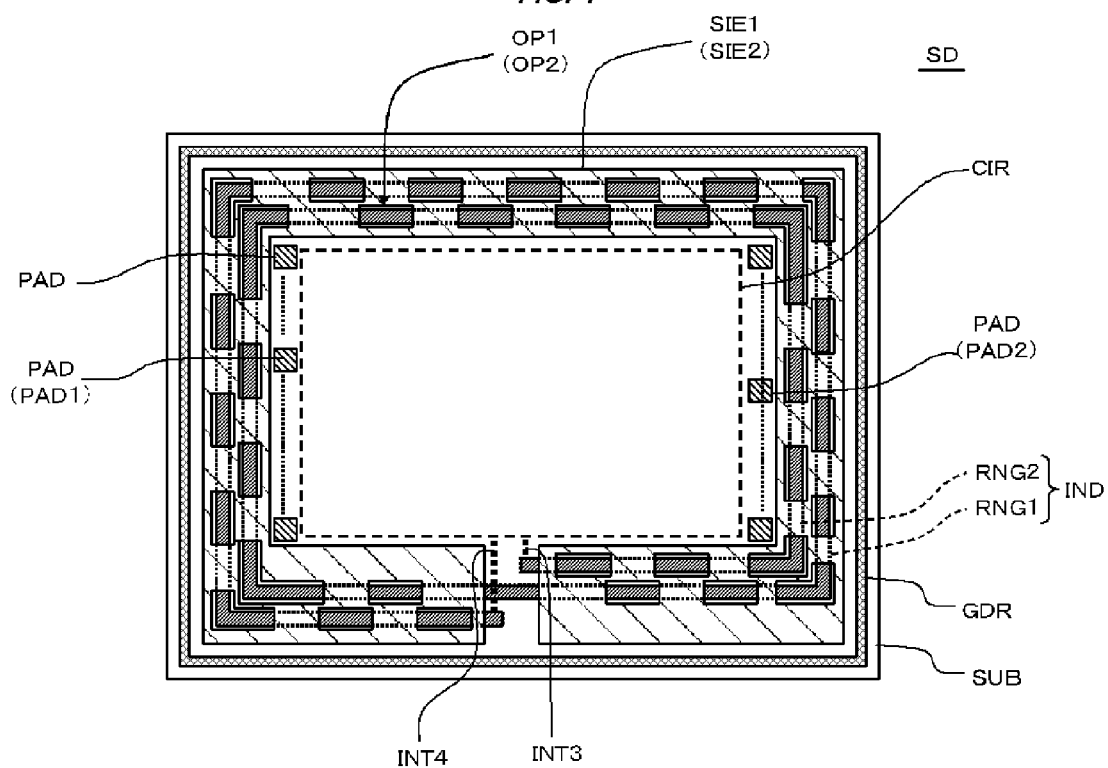
FIG. 4 is a diagram showing a modification of FIG. 1.

FIG. 4 is a diagram showing a modification of FIG. 1. The example shown in this drawing has the same configuration as the example explained by the use of FIG. 1 to FIG. 3 except a layout of the electrode pad PAD. In the example shown in this drawing, the electrode pad PAD is provided between the inductor IND and the internal circuit CIR in the planar view.

Figure 5:
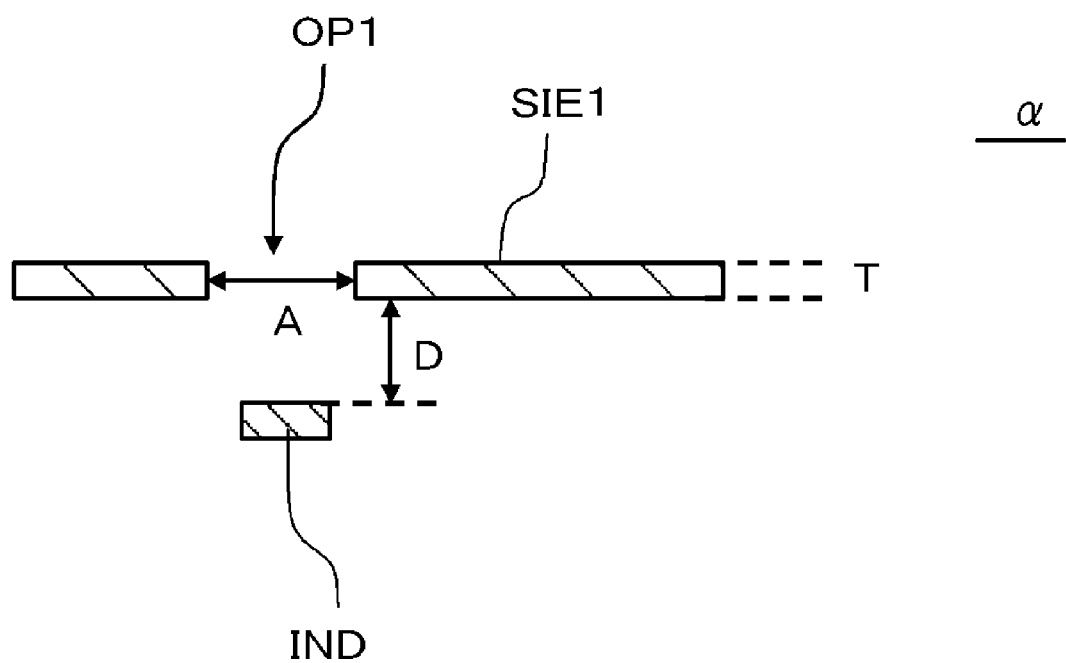
FIG. 5 is a diagram for explaining relative positions of a first opening and an inductor.

FIG. 5 is a diagram for explaining relative positions of the first opening OP1 and the inductor IND. When the opening width of the first opening OP1 is denoted by A, the thickness of the upper shield part SIE1 is denoted by T, and the distance between the lower surface of the upper shield part SIE1 and the upper surface of the inductor IND is denoted by D, a relationship is provided as $A \leq (T+D) \times 2/3$. The noise shield effect by the upper shield part SIE1 is reduced as the opening width A is increased. Then, when the above described relationship is satisfied, a noise magnitude leaked to the outside of the upper shield part SIE1 can be made 1/10 of that in the case without the upper shield part SIE1. Note that the length of the first opening OP1 in the longitudinal direction is preferably configured so as to satisfy the same condition as the opening width A.

Figure 6:
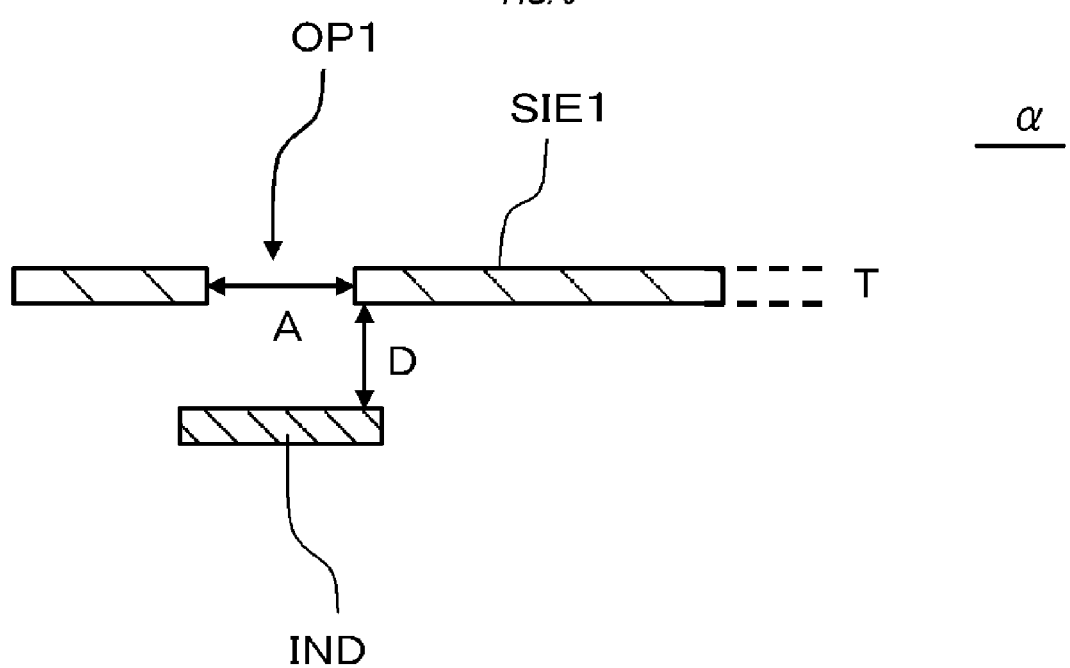
FIG. 6 is a diagram showing a modification of FIG. 5.

Here, in the examples shown in FIG. 1, FIG. 3, FIG. 4, and FIG. 5, the width of the first opening OP1 is larger than the width of the inductor IND. Note that the width of the first opening OP1 may be smaller than the width of the inductor IND as shown in FIG. 6.

Figure 7:
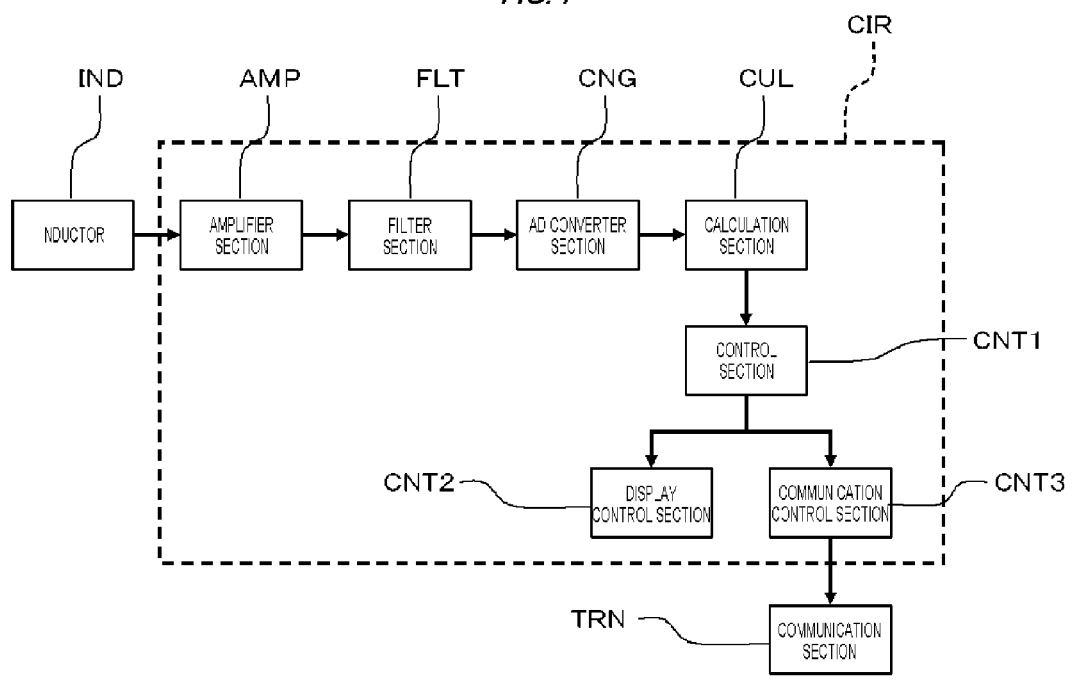
FIG. 7 is a functional block diagram showing a circuit configuration of an internal circuit.

FIG. 7 is a functional block diagram showing a circuit configuration of the internal circuit CIR. The internal circuit CIR includes an amplifier section AMP, a filter section FLT, an AD converter section CNG, a calculation section CUL, a control section CNT1, a display control section CNT2, and a communication control section CNT3. The amplifier section AMP amplifies a voltage signal generated across the inductor IND. The filter section FLT provides filtering processing for an output from the amplifier section AMP and selects only a necessary band component. The AD converter section CNG converts an analog signal output from the filter section FLT into a digital signal. The calculation section CUL processes the digital signal output from the AD converter section CNG and calculates a power amount flowing a power line. The control section CNT1 controls the display control section CNT2 and the communication control section CNT3. The display control section CNT2 causes a display device to display the power amount according to an instruction from the control section CNT1. The communication control section CNT3 outputs the power amount to the outside through a communication section TRN according to an instruction from the control section CNT1. The communication section TRN may be an antenna for wireless communication.

In the above described configuration of the internal circuit CIR, the amplifier section AMP, the filter section FLT, and the AD converter section CNG are configured with analog circuits, and the calculation section CUL, the control section CNT1, the display control section CNT2, and the communication control section CNT3 are configured with digital circuits.

Note that the internal circuit CIR may include an oscillator circuit, a timer, and an RTC (Real Time Clock) other than the above described configuration.

Figure 8:
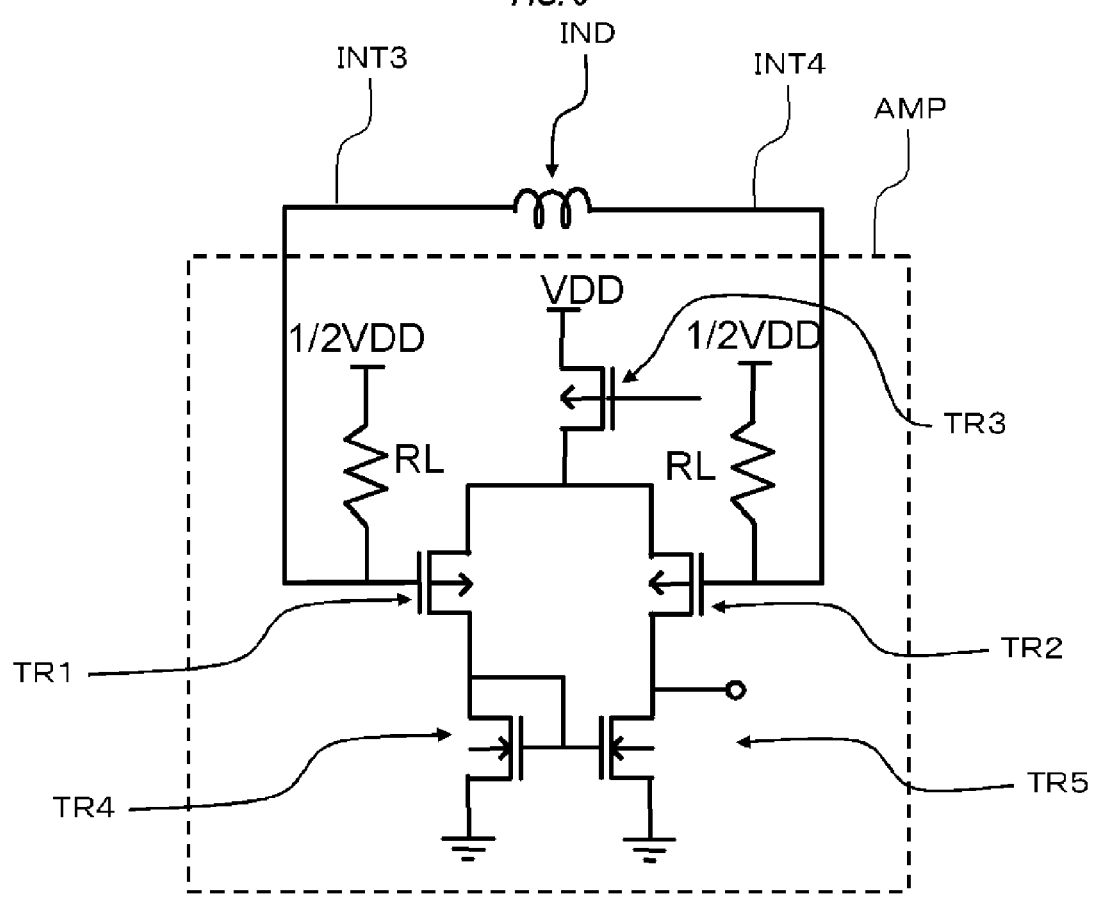
FIG. 8 shows an example of a circuit diagram for an amplifier section.

FIG. 8 is an example of a circuit diagram for the amplifier section AMP. The amplifier section AMP is configured by the use of plural transistors TR. Among these transistors TR, the gate electrode of a p-type transistor TR1 is coupled with the third coupling path INT3, and the gate electrode of a p-type transistor TR2 is coupled with the fourth coupling path INT4. A half voltage of the power source voltage (½VDD) is applied to the gate electrode of the transistor TR1 and the gate electrode of the transistor TR2 through respective resistors RL which are different from each other. Here, the power source voltage (VDD) is applied to the drain of the transistor TR1 and the drain of the transistor TR2 through a p-type transistor TR3. Further, the source of the transistor TR1 is coupled to the drain of an n-type transistor TR4 and the source of the transistor TR2 is coupled to the drain of an n-type transistor TR5. Each of the source of the transistor TR4 and the source of the transistor TR5 is grounded. Each of the gate electrode of the transistor TR4 and the gate electrode of the transistor TR5 is coupled to the drain of the transistor TR4. Then, an output terminal of the amplifier section AMP is coupled to the drain of the transistor TR5.

Figure 9:
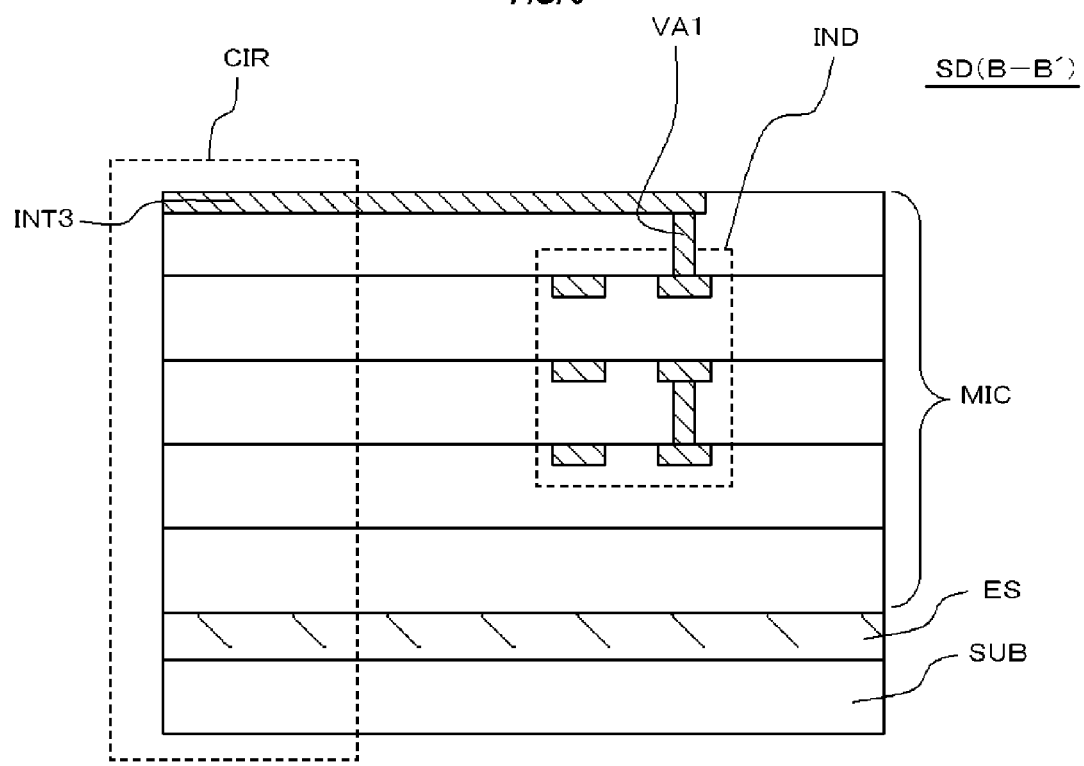
FIG. 9 is a diagram showing a first example for a B-B' cross section of FIG. 1.
Figure 10:
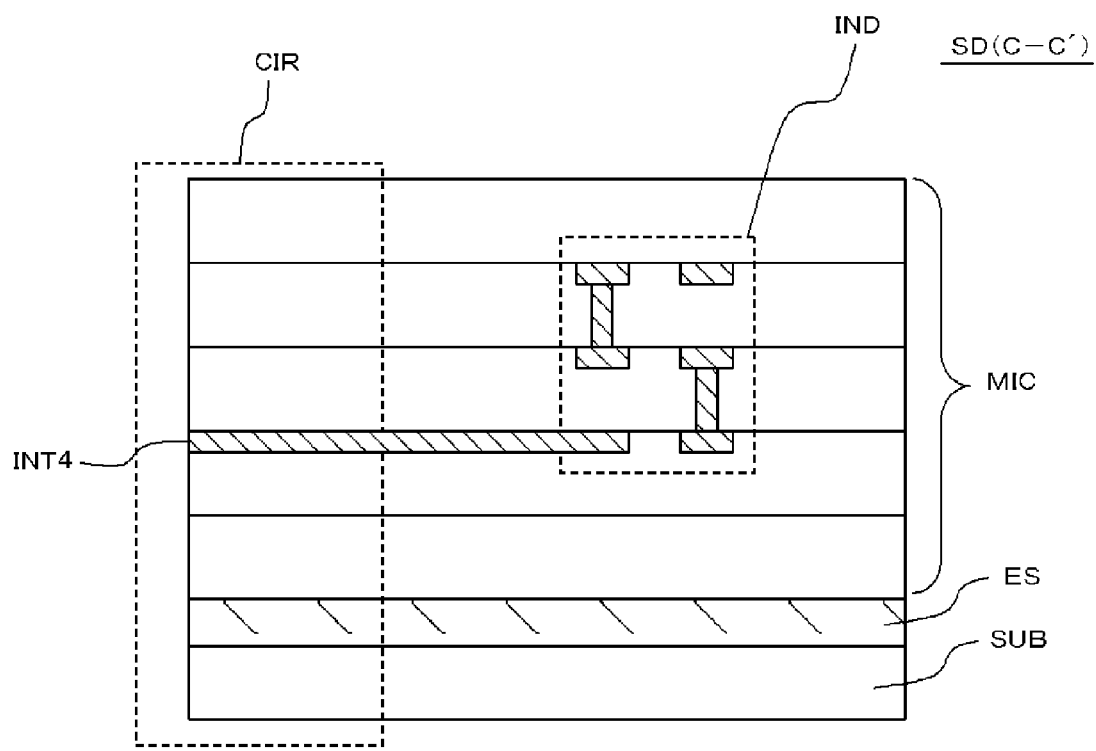
FIG. 10 is a diagram showing a first example for a C-C' cross section of FIG. 1.

FIG. 9 shows a first example of a B-B' cross section of FIG. 1, and FIG. 10 shows a first example of a C-C' cross section of FIG. 1. As shown in FIG. 1, the upper shield part SIE1 and the lower shield part SIE2 are not formed above both ends of the inductor IND. Then, in the parts where the upper shield part SIE1 and the lower shield part SIE2 are not formed, the third coupling path INT3 and the fourth coupling path INT4 are formed.

In an example shown in FIG. 9 and FIG. 10, the inductor IND is formed by the use of an odd number of wiring layers (e.g., three layers). Then, one end of the inductor IND is located on the outermost perimeter of a spiral wiring located in the top wiring layer, and the other end of the inductor IND is located on the innermost perimeter of a spiral wiring located in the bottom wiring layer.

As shown in FIG. 9, the third coupling path INT3 has a wiring in the same layer as the upper shield part SIE1. One end of this wiring is coupled to the one end of the inductor IND through a via VA1 which is one of the vias VA, and the other end is extended to the internal circuit CIR. By such a coupling structure, the third coupling path INT3 does not interfere with a part except the one end of the inductor IND.

Then, as shown in FIG. 10, the fourth coupling path INT4 has a wiring in the same layer as the spiral wiring located in the bottom layer of the inductor IND. One end of this wiring is coupled to the other end of the inductor IND and the other end is extended to the internal circuit CIR.

Figure 11:
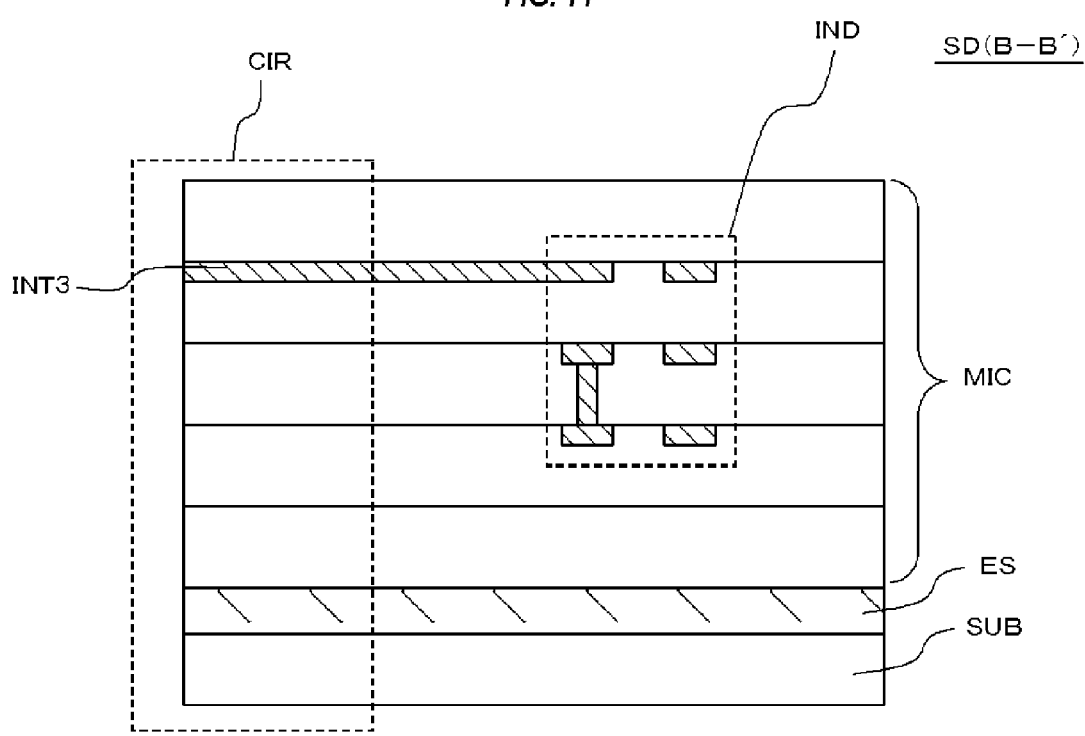
FIG. 11 is a diagram showing a second example for a B-B' cross section of FIG. 1.
Figure 12:
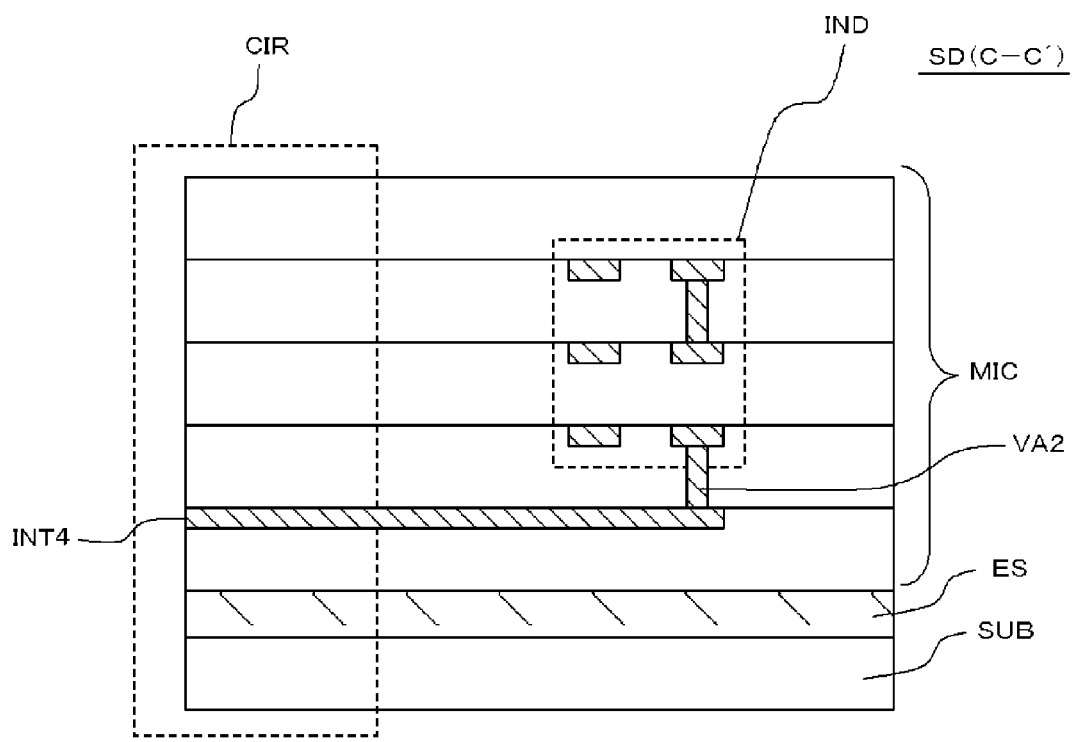
FIG. 12 is a diagram showing a second example for a C-C' cross section of FIG. 1.

FIG. 11 shows a second example of the B-B' cross section of FIG. 1, and FIG. 12 shows a second example of the C-C' cross section of FIG. 1. Also in an example shown in these drawings, the inductor IND is formed by the use of an odd number of wiring layers (e.g., three layers). Here, one end of the inductor IND is located on the innermost perimeter of a spiral wiring located in the top wiring layer, and the other end of the inductor IND is located on the outermost perimeter of a spiral wiring located in the bottom wiring layer.

As shown in FIG. 11, the third coupling path INT3 has a wiring in the same layer as the spiral wiring located in the top layer of the inductor IND. One end of this wiring is coupled to one end of the inductor IND and the other end is extended to the internal circuit CIR.

Then, as shown in FIG. 12, the fourth coupling path INT4 has a wiring in the same layer as the lower shield part SIE2. One end of this wiring is coupled to the other end of the inductor IND through a via VA2 which is one of the vias VA. Here, the other end of this wiring is extended to the internal circuit CIR. By such a coupling structure, the fourth coupling path INT4 does not interfere with a part except the other end of the inductor IND.

Figure 13:
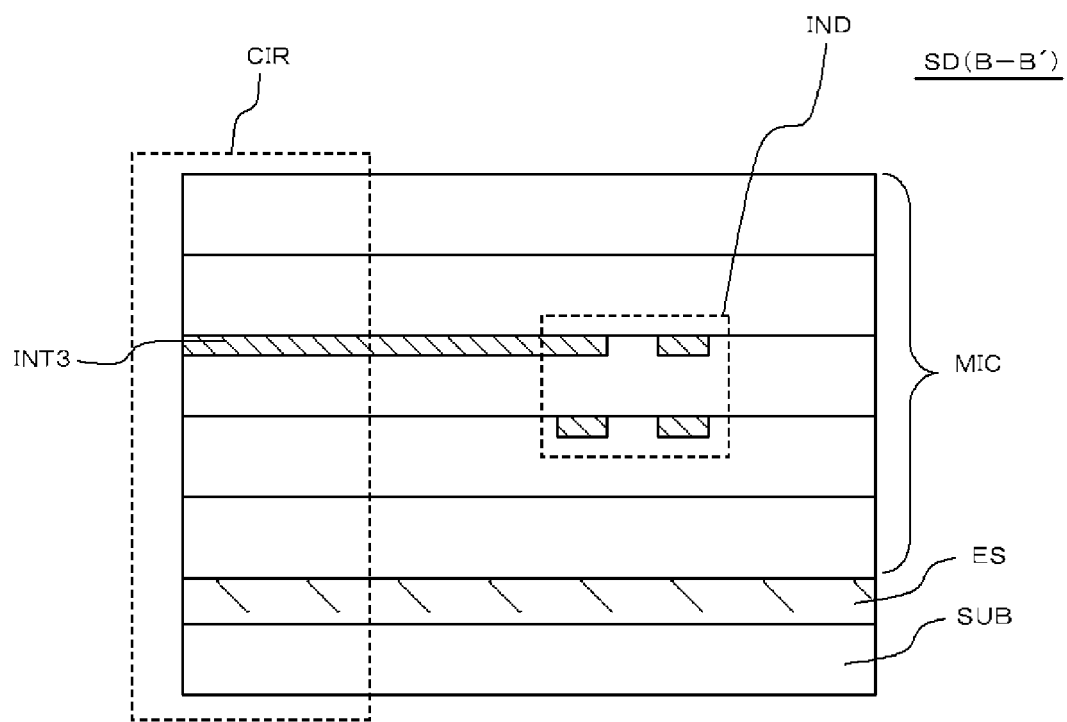
FIG. 13 is a diagram showing a third example for a B-B' cross section of FIG. 1.
Figure 14:
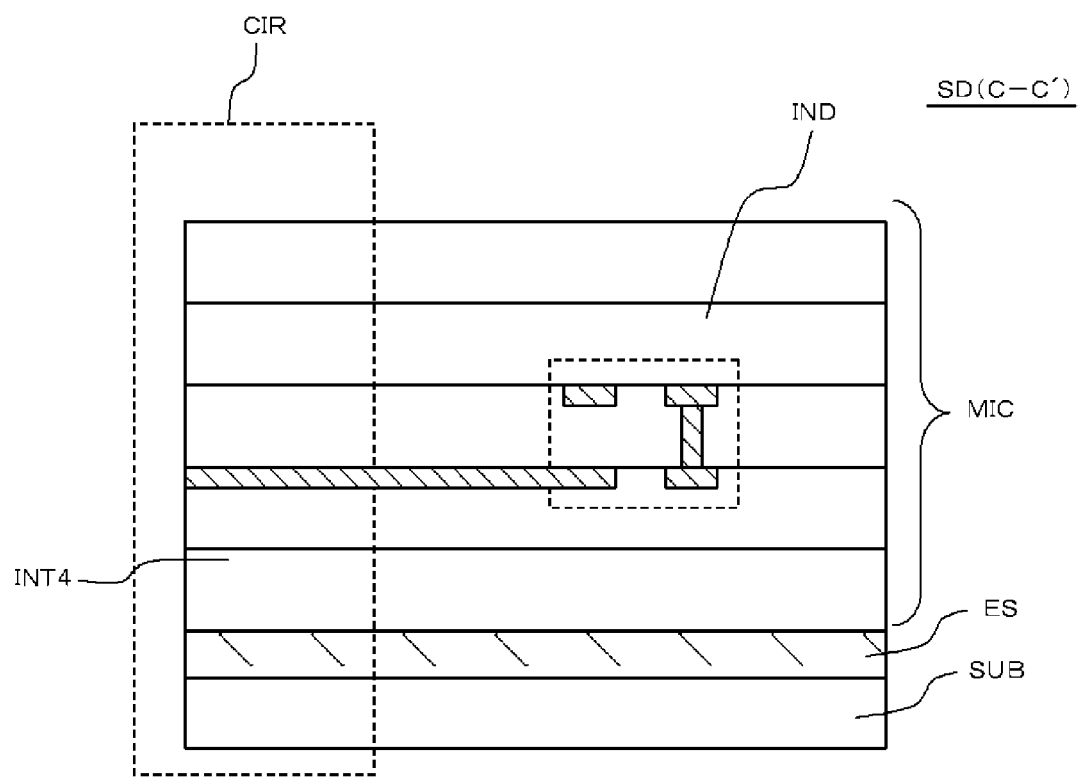
FIG. 14 is a diagram showing a third example for a C-C' cross section of FIG. 1.

FIG. 13 shows a third example of the B-B' cross section of FIG. 1 and FIG. 14 shows a third example of the C-C' cross section of FIG. 1. In an example shown in these drawings, the inductor IND is formed by the use of an even number of wiring layers (e.g., two layers). One end of the inductor IND is located on the innermost perimeter of a spiral wiring located in the top wiring layer, and the other end of the inductor IND is located on the innermost perimeter of a spiral wiring located in the bottom wiring layer. Then, as shown in FIG. 13, the third coupling path INT3 has a wiring in the same layer as the spiral wiring located in the top layer of the inductor IND. One end of this wiring is coupled to one end of the inductor IND and the other end is extended to the internal circuit CIR. Further, as shown in FIG. 14, the fourth coupling path INT4 has a wiring in the same layer as the spiral wiring located in the bottom layer of the inductor IND. One end of this wiring is coupled to the other end of the inductor IND and the other end of this wiring is extended to the internal circuit CIR.

As described above, according to the present embodiment, the upper side of the inductor IND is covered by the upper shield part SIE1 and the lower side of the inductor IND is covered by the lower shield part SIE2. Thereby, it is possible to suppress that the noise caused by the inductor is leaked to the outside. Further, the first opening OP1 is formed in the upper shield part SIE1, and thereby the intensity change of the external magnetic field reaches the inductor IND.

In particular, in the present embodiment, the lower shield part SIE2 is formed also by the use of the wiring layer. Thereby, it is possible to obtain a higher shield effect by the lower shield part SIE2. Then, the lower shield part SIE2 has the plural second openings OP2. The second opening OP2 overlaps the inductor IND in the planar view. Thereby, the intensity change of the external magnetic field reaches the inductor further easily.

Second Embodiment

Figure 15:
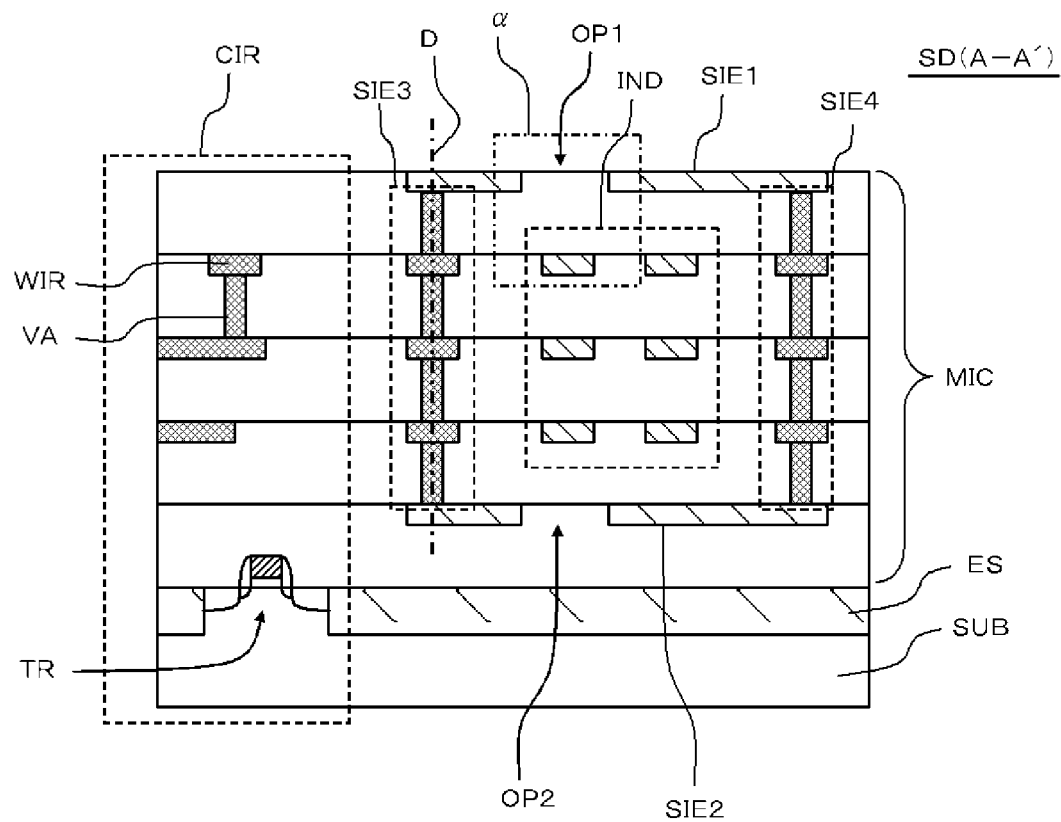
FIG. 15 is a cross-sectional view showing a configuration of a semiconductor device according to a Second Embodiment.

FIG. 15 is a cross-sectional view showing a configuration of a semiconductor device SD according to a Second Embodiment, and corresponds to FIG. 3 (i.e., A-A' cross-sectional view of FIG. 1) in the First Embodiment. The semiconductor device SD according to the present embodiment has the same configuration as the semiconductor device SD according to the First Embodiment, except on a point that a first side shield part SIE3 and a second side shield part SIE4 are provided.

Each of the first side shield part SIE3 and the second side shield part SIE4 is formed by the use of the multilayered wiring layer MIC. In detail, each of the first side shield part SIE3 and the second side shield part SIE4 is formed continuously from the wiring layer one-layer higher than the wiring layer where the lower shield part SIE2 is formed to the wiring layer where the upper shield part SIE1 is formed. Each wiring layer of the first side shield part SIE3 and the second side shield part SIE4 has a metal layer located in the same layer as the layer where the internal wiring WIR is formed and a metal layer located in the same layer as the via layer where the via VA is formed.

The first side shield part SIE3 is located between the internal circuit CIR and the inductor IND in the planar view, and surrounds the whole periphery of the internal circuit CIR. That is, in the present embodiment, the inductor IND and the internal circuit CIR are separated by the first side shield part SIE3. Thereby, it is possible to further suppress that the inductor IND becomes a noise source of the internal circuit CIR.

The second side shield part SIE4 is located between the inductor IND and the edge of the substrate SUB in the planar view, and surrounds the whole periphery of the inductor IND. Each of the first side shield part SIE3 and the second side shield part SIE4 couples the upper shield part SIE1 and the lower shield part SIE2 in the thickness direction. That is, in the present embodiment, the inductor IND is surrounded by the upper shield part SIE1, the lower shield part SIE2, the first side shield part SIE3, and the second side shield part SIE4. Thereby, it is possible to further suppress that the inductor IND becomes a noise source of the internal circuit CIR.

Figure 16:
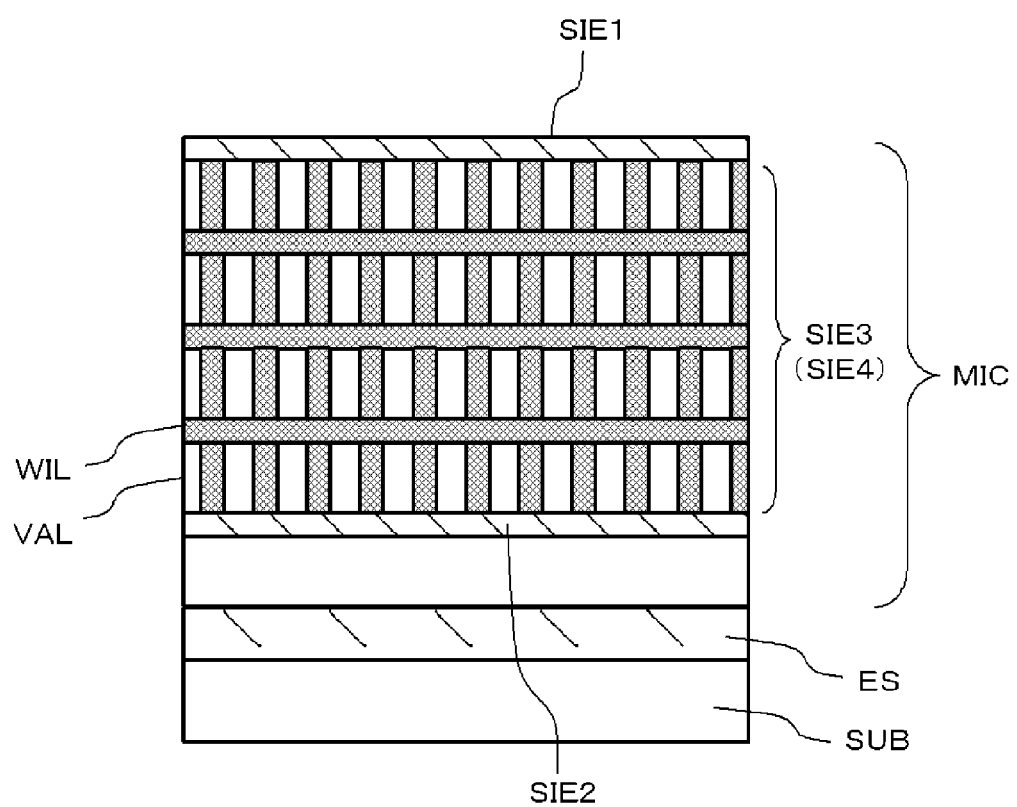
FIG. 16 is a first example for a cross-sectional view of a semiconductor device in a plane indicated by line D of FIG. 15.

FIG. 16 is a first example for a cross-sectional view of the semiconductor device SD in a plane indicated by line D of FIG. 15 and shows a first example of a configuration of the first side shield part SIE3. Each wiring layer configuring the multilayered wiring layer MIC includes a via layer VAL where the via VA is formed and a wiring layer WIL where the wiring is formed. Then, a part of the first side shield part SIE3 located in the via layer VAL is configured with plural vias which are separated from one another. The diameter of the via is the same as that of the via VA of the internal circuit CIR located in the same via layer VAL. Then, an arrangement spacing of the vias configuring the first side shield part SIE3 is the minimum spacing in the via layer VAL to which the vias belong, and is the same as an arrangement spacing of dummy vias, for example. Thereby, it is possible to form a part of the first side shield part SIE3 located in the via layer VAL easily in the same process as that for vias and dummy vias of the internal circuit CIR.

Note that, in the example shown in FIG. 16, a part of the first side shield part SIE3 located in the same layer as the internal wiring WIR is formed across the whole periphery without a gap.

Figure 17:
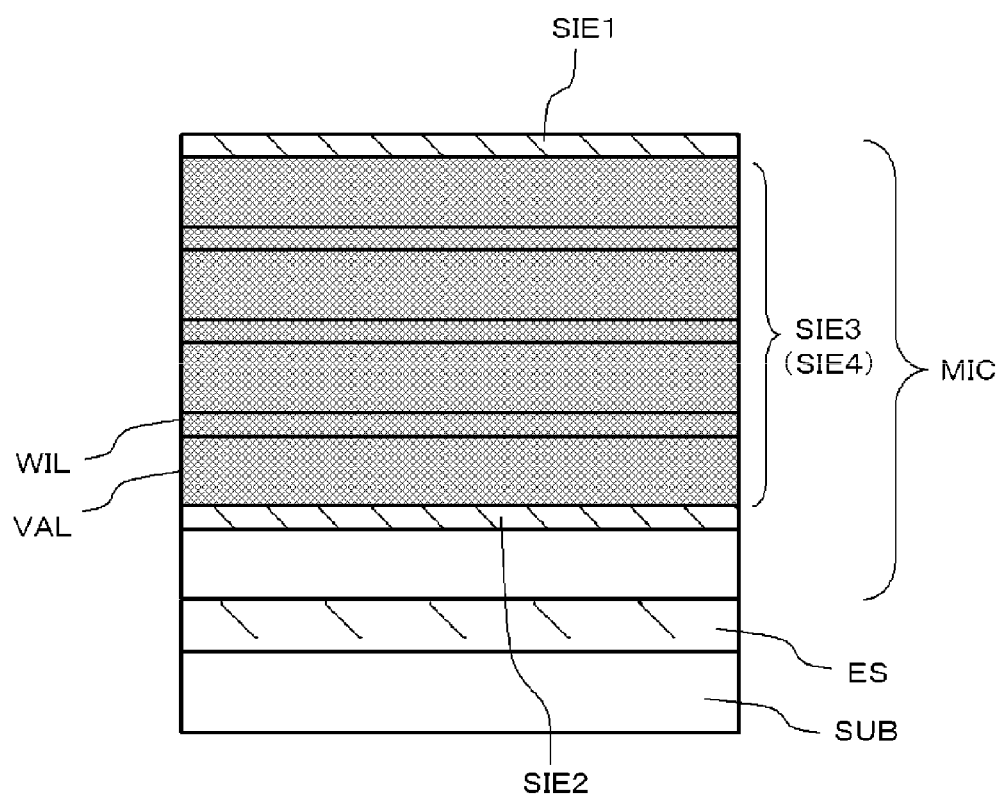
FIG. 17 is a second example for a cross-sectional view of a semiconductor device in a plane indicated by line D of FIG. 15.

FIG. 17 is a second example for a cross-sectional view of the semiconductor device SD in a plane indicated by line D of FIG. 15 and shows a second example of a configuration of the first side shield part SIE3. The example shown in this drawing is the same as the example shown in FIG. 16 except on a point that a part of the first side shield part SIE3 located in the via layer is configured with a slit via. According to the example shown in this drawing, the first side shield part SIE3 is formed across the whole periphery without a gap in each of a part located in the same layer as the internal wiring WIR and a part located in the via layer. Accordingly, the shield effect of the first side shield part SIE3 becomes higher.

Note that the second side shield part SIE4 also has the same configuration as either of the first side shield parts SIE3 shown in FIG. 16 or FIG. 17.

Also according to the present embodiment, it is possible to obtain the same effect as that of the First Embodiment. Further, the first side shield part SIE3 and the second side shield part SIE4 are provided, and thereby it is possible to further suppress that the inductor IND becomes a noise source of the internal circuit CIR.

Third Embodiment

Figure 18:
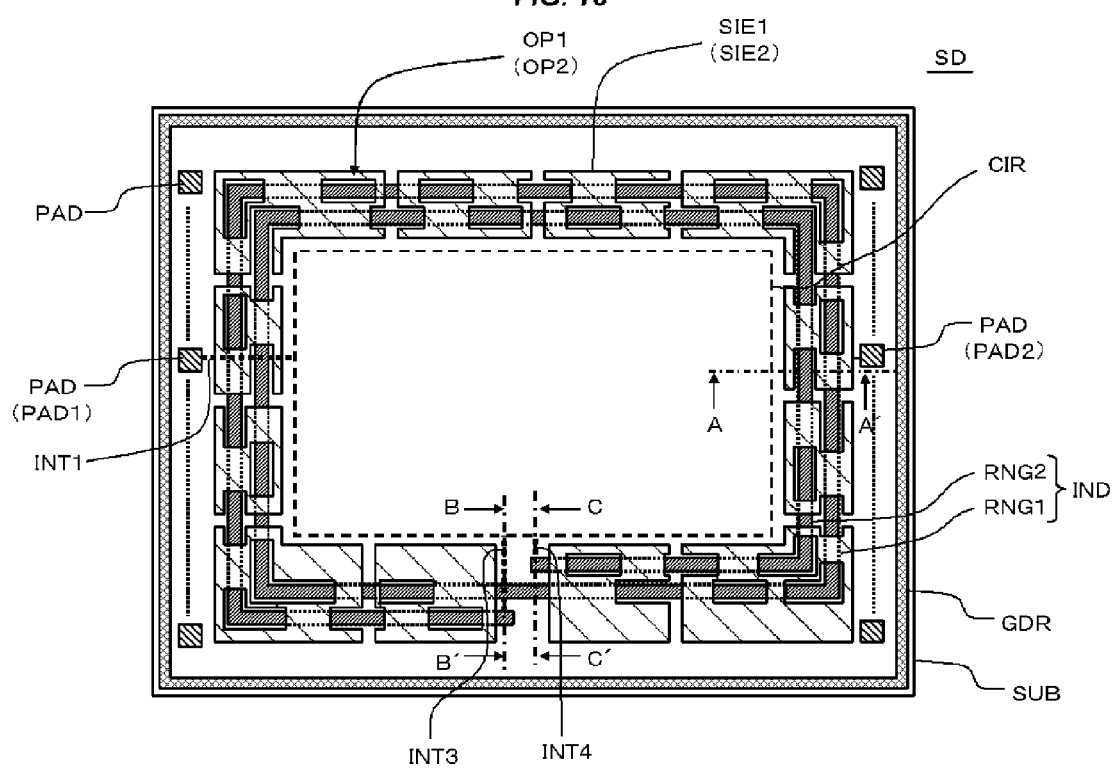
FIG. 18 is a plan view showing a configuration of a semiconductor device according to a Third Embodiment.

FIG. 18 a plan view showing a configuration of a semiconductor device SD according to a Third Embodiment, and corresponds to FIG. 1 in the First Embodiment. The semiconductor device SD according to the present embodiment has the same configuration as the semiconductor device SD according to the First Embodiment, except on a point that both of the upper shield part SIE1 and the lower shield part SIE2 are divided into plural conductor pieces. That is, in the present embodiment, each of the upper shield part SIE1 and the lower shield part SIE2 has a configuration in which the plural conductor pieces are arranged along the inductor IND.

In detail, the upper shield part SIE1 and the lower shield part SIE2 are divided at the same positions when viewed in the direction along the inductor IND. Note that the upper shield part SIE1 and the lower shield part SIE2 may be divided at positions different from each other when viewed in the direction along the inductor IND. Here, fixed potentials (power source potentials or ground potentials) the same as one another are applied to the plural conductor pieces configuring the upper shield part SIE1, and fixed potentials (power source potentials or ground potentials) the same as one another are also applied to the plural conductor pieces configuring the lower shield part SIE2.

Also according to the present embodiment, it is possible to obtain the same effect as that of the First Embodiment. Further, the upper shield part SIE1 and the lower shield part SIE2 are divided into the plural conductor pieces, and thereby it is possible to suppress that eddy current is generated in each of the upper shield part SIE1 and the lower shield part SIE2. In this case, it is possible to suppress that the detection sensitivity of the magnetic field change by the inductor IND is degraded.

Note that, also in the Second Embodiment, as in the present embodiment, the upper shield part SIE1 and the lower shield part SIE2 may be divided into plural conductor pieces. In this case, also the first side shield part SIE3 and the second side shield part SIE4 are divided into plural conductor pieces as the upper shield part SIE1 and the lower shield part SIE2. In this case, the upper shield part SIE1, the lower shield part SIE2, the first side shield part SIE3, and the second side shield part SIE4 are divided at the same positions when viewed in the direction along the inductor IND. Also in such a configuration, it is possible to obtain the same effect as that of the Third Embodiment.

Fourth Embodiment

Figure 19:
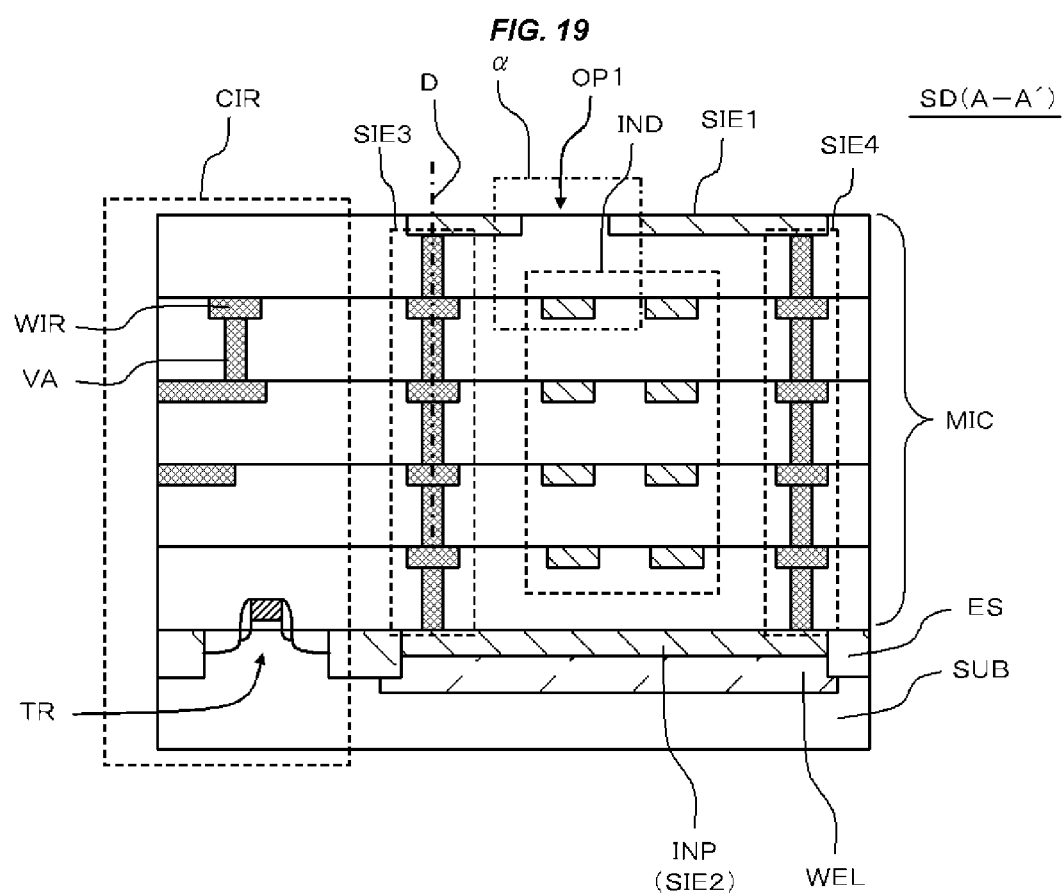
FIG. 19 is a cross-sectional view showing a configuration of a semiconductor device according to a Fourth Embodiment.

FIG. 19 is a cross-sectional view showing a configuration of a semiconductor device SD according to a Fourth Embodiment, and corresponds to FIG. 3 (i.e., A-A' cross-sectional view of FIG. 1) in the First Embodiment. The semiconductor device according to the present embodiment has the same configuration as the semiconductor devices SD according to the First to Third Embodiments, except a configuration of the lower shield part SIE2. FIG. 19 shows the same case as that of the Second Embodiment.

In the present embodiment, the lower shield part SIE2 is configured with an impurity layer INP formed in the substrate SUB. The impurity layer INP is located in a surface layer of a well WEL formed in the substrate SUB. The impurity layer INP and the well WEL may be impurity layers having the same conductivity type as each other, or may be impurity layers having conductor types different from each other. Here, when the impurity layer INP is an impurity layer having a p-type, the ground potential is applied to the impurity layer INP, and, when the impurity layer INP is an impurity layer having an n-type, the source potential is applied to the impurity layer INP.

Also according to the present embodiment, it is possible to obtain the same effect as those of the First to Third Embodiment. Further, the lower shield part SIE2 may not be located in the multilayered wiring layer MIC, and thereby it is possible to increase the number of wiring layers configuring the inductor IND. In this case, it is possible to increase the number of windings of the inductor IND.

Further, when the impurity layer INP and the well WEL are impurity layers having the conductor types different from each other, a depletion layer is generated at the boundary thereof. In this case, the shield effect by the lower shield part SIE2 is improved.

Figure 20:
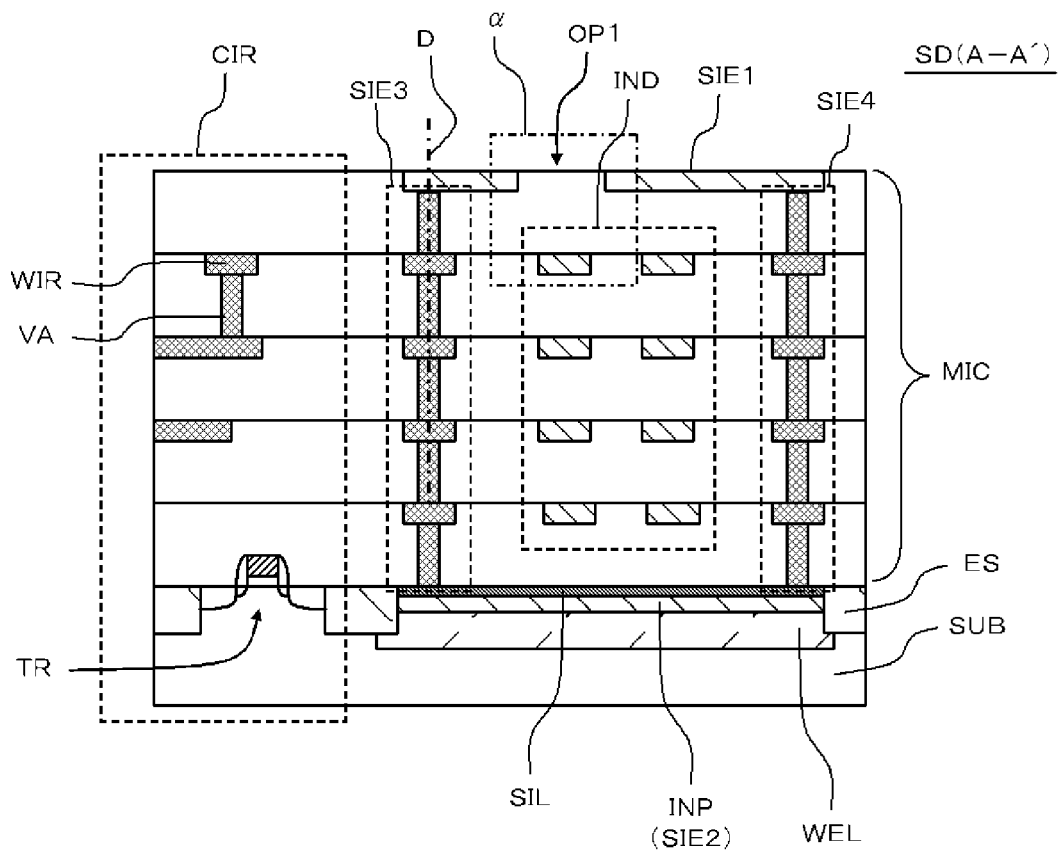
FIG. 20 is a cross-sectional view showing a modification of FIG. 19.

Note that, as shown in FIG. 20, a silicide layer SIL may be formed in the surface layer of the impurity layer INP. In this case, since the impurity layer INP is caused to have a lower resistivity, potential of the impurity layer INP is stabilized.

Fifth Embodiment

Figure 21:
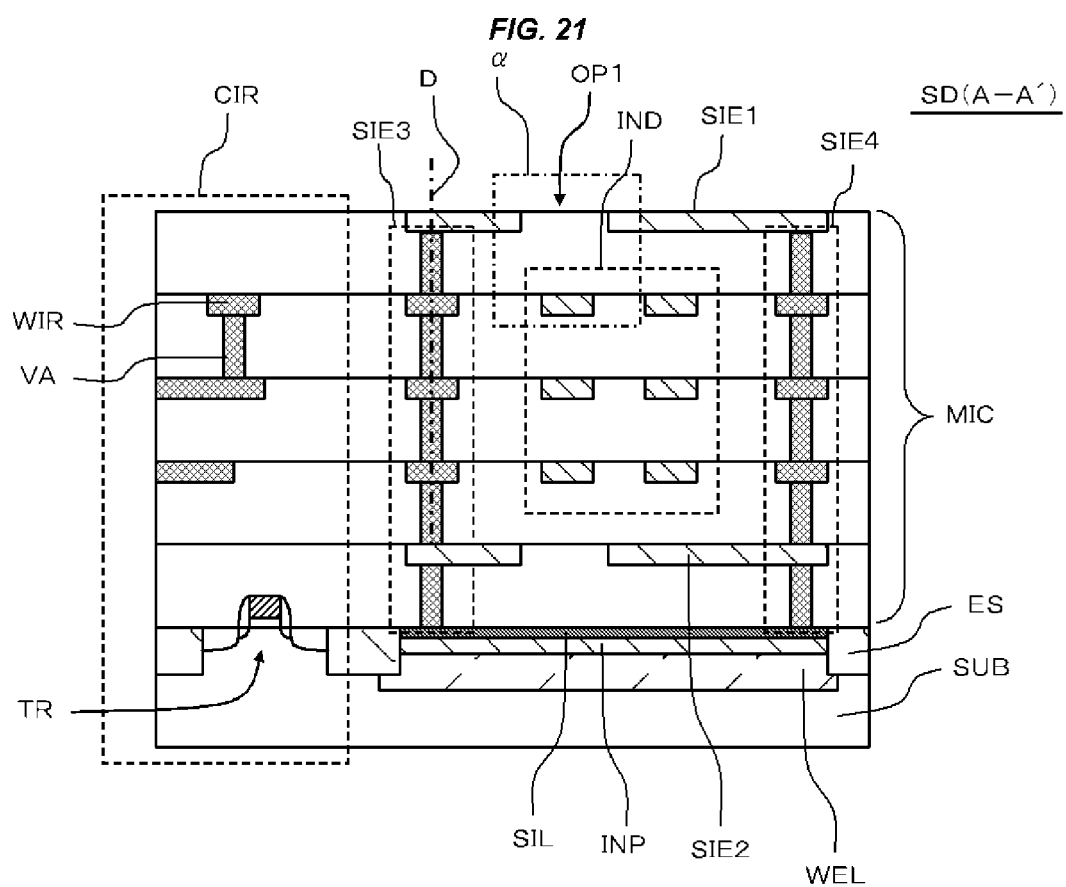
FIG. 21 is a cross-sectional view showing a configuration of a semiconductor device according to a Fifth Embodiment.

FIG. 21 is a cross-sectional view showing a configuration of a semiconductor device SD according to a Fifth Embodiment, and corresponds to FIG. 3 (i.e., A-A' cross-sectional view of FIG. 1) in the First Embodiment. The semiconductor device SD according to the present embodiment has the same configuration as any of the First to Third Embodiment, except on a point that an impurity layer INP, a well WEL, and a silicide layer SIL are provided under the lower shield part SIE2. This drawing shows the same case as that of the Second Embodiment. The impurity layer INP, the well WEL, and the silicide layer SIL are configured as shown in the Fourth Embodiment. Then, the silicide layer SIL is coupled to the lower shield part SIE2 through a via. This via may be a shielded via.

Also according to the present embodiment, it is possible to obtain the same effect as those of the First to Third Embodiment. Further, the lower side of the inductor IND is shielded by the two layers of the lower shield part SIE2 and the impurity layer INP. Accordingly, it is possible to further suppress that noise is leaked to the outside from the lower side of the inductor IND.

While the invention achieved by the present inventors has been explained according to the embodiments as described above, obviously the present invention is not limited to the embodiments and can be changed variously in a range without departing from the gist thereof.

What is claimed is:

1. A semiconductor device, comprising:
   a substrate;
   an internal circuit provided on the substrate;
   an inductor which surrounds the internal circuit in a planar view; and
   at least one of:
      an upper shield part which is located above the inductor in a thickness direction, and has at least one first opening overlapping the inductor; and
      a lower shield part which is located below the inductor in a thickness direction, and has at least one second opening overlapping the inductor.

2. The semiconductor device according to claim 1, wherein the lower shield part is formed by use of a multilayered wiring layer.

3. The semiconductor device according to claim 2, wherein the lower shield part has plural second openings each overlapping the inductor.

4. The semiconductor device according to claim 3, wherein the first opening and the second opening overlap each other at least in a part thereof.

5. The semiconductor device according to claim 2, wherein the lower shield part further includes an impurity layer formed in the substrate.

6. The semiconductor device according to claim 1, wherein the lower shield part includes an impurity layer formed in the substrate.

7. The semiconductor device according to claim 6, wherein a silicide layer formed in a surface layer of the impurity layer is provided.

8. The semiconductor device according to claim 1, wherein the first opening has a rectangular shape and also has a longitudinal direction parallel to the inductor.

9. The semiconductor device according to claim 1, wherein the inductor surrounds the internal circuit in plural turns,
   wherein a first ring-like member, which is a first turn of the inductor, and a second ring-like member, which is a second turn of the inductor, shift from each other in the planar view, and
   the upper shield part includes a plurality of first openings, the first openings include at least one first opening above the first ring-like member and at least one first opening above the second ring-like member.

10. The semiconductor device according to claim 9, wherein the at least one first opening above the first ring-like member and the at least one first opening above the second ring-like member are arranged alternately in a direction parallel to the inductor.

11. The semiconductor device according to claim 1, wherein, when an opening width of the first opening is denoted by A, a thickness of the upper shield part is denoted by T, and a distance between a lower surface of the upper shield part and an upper surface of the inductor is denoted by D, a relationship is provided as $A \leq (T+D) \times \frac{2}{3}$.

12. The semiconductor device according to claim 1, further comprising:
   a multilayered wiring layer;
   a first electrode pad and a second electrode pad provided in the multilayered wiring layer;
   a first coupling path coupling the first electrode pad to the internal circuit; and
   a second coupling path coupling the second electrode pad to the upper shield part.

13. The semiconductor device according to claim 1, wherein the upper shield part has a configuration in which plural conductor pieces are arranged along the inductor in the planar view.

14. The semiconductor device according to claim 1, further comprising:
   a multilayered wiring layer;
   a first side shield part which is formed by use of the multilayered wiring layer, is located between the inductor and the internal circuit in the planar view, and couples the upper shield part and the lower shield part in the thickness direction.

15. The semiconductor device according to claim 14, wherein the multilayered wiring layer includes a via layer where a via is formed, and
   a part of the first side shield part located in the via layer is configured with a plurality of vias which are separated from one another.

16. The semiconductor device according to claim 14, wherein the multilayered wiring layer has a via layer where a via is formed, and
   a part of the first side shield part located in the via layer is configured with a slit via.

17. The semiconductor device according to claim 14, still further comprising:
   a second side shield part which is formed by use of the multilayered wiring layer, the second side shield part is provided on an outer perimeter side of the semiconductor device from the inductor in the planar view, and couples the upper shield part and the lower shield part in the thickness direction.

* * * * *